United States Patent
Vromans et al.

(10) Patent No.: US 8,526,536 B2
(45) Date of Patent: Sep. 3, 2013

(54) QUAD LINC TRANSMITTER WITH SWITCHABLE CHIREIX AMPLIFIERS

(75) Inventors: Jan Sophia Vromans, Maastricht (NL); Mark Pieter van der Heijden, 's-Hertogenbosch (NL); Mustafa Acar, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/320,013

(22) PCT Filed: May 15, 2010

(86) PCT No.: PCT/IB2010/052159
§ 371 (c)(1),
(2), (4) Date: Nov. 16, 2011

(87) PCT Pub. No.: WO2010/131232
PCT Pub. Date: Nov. 18, 2010

(65) Prior Publication Data
US 2012/0069930 A1    Mar. 22, 2012

(30) Foreign Application Priority Data
May 15, 2009   (EP) .................................. 09160364

(51) Int. Cl.
H04L 25/49   (2006.01)
H04B 1/04    (2006.01)
H04B 1/02    (2006.01)
H03F 3/68    (2006.01)

(52) U.S. Cl.
USPC ........ 375/297; 375/295; 375/296; 455/114.3; 455/114.2; 455/91; 330/295; 330/250

(58) Field of Classification Search
USPC ................... 375/298, 264; 455/114.3, 127.1; 330/295
See application file for complete search history.

(56) References Cited

U.S. PATENT DOCUMENTS

| 7,260,368 B1 | 8/2007 | Blumer |
| 7,570,711 B1* | 8/2009 | Chavez et al. ................ 375/298 |

(Continued)

FOREIGN PATENT DOCUMENTS

| JP | 2006-314087 A | 11/2006 |
| WO | 2004/057755 A1 | 7/2004 |

(Continued)

OTHER PUBLICATIONS

H. Chireix, "High Power Outphasing Modulation," Proceeding of the Institute of Radio Engineers, vol. 23, No. 11, pp. 1370-1392 (Nov. 1935).

(Continued)

Primary Examiner — Chieh M Fan
Assistant Examiner — Michelle M Koeth

(57) ABSTRACT

A transmitter (200) comprises a first Chireix compensation circuit (230, 232, 238, 240) and a second Chireix compensation circuit (234, 236, 238, 240), wherein each Chireix compensation circuit has two inputs and two outputs. Two constant envelope input signals (22, 224) to be amplified are guided by a switch (226) to either the first or second Chireix amplifier unit. The selection as such depends on the phase (212) of the input signals to be amplified. The outputs of the two Chireix compensation circuits are cross-coupled to an inductive load (242). A Chireix inductor (238) and a Chireix capacitor (240), each having one terminal grounded, are also connected to the inductive load (242). By switching the signals to be amplified in response to their phase, optimum matching is ensured.

14 Claims, 14 Drawing Sheets

(56) References Cited

U.S. PATENT DOCUMENTS 7,800,442 B2 * 9/2010 Lejon .................. 330/124 R
7,953,380 B2 * 5/2011 Birafane ................ 455/127.3

FOREIGN PATENT DOCUMENTS

| WO | 2007/029119 A2 | 3/2007 |
| WO | 2007/052994 A1 | 5/2007 |
| WO | 2007/117189 A1 | 10/2007 |
| WO | 2008/090598 A1 | 7/2008 |

OTHER PUBLICATIONS

Zhang, X. et al. "Design of Linear RF Outphasing Power Amplifiers", Artech House Inc., pp. 1-200 (2003).

Hakala, I. et al. "Chirexi Power Combing with Saturated Class-B-Power Amplifiers", Microwave Conference, 34$^{th}$ European, Amsterdam, The Netherlands, IEEE, vol. 1. No. 11, pp. 1-4 (Oct. 11, 2004).

Hegazi, G.M. et al. "Improved LINC Power Transmission Using a Quadrature Outphasing Technique", IEEE MTT-S International Microwave Symposium, pp. 1923-1926 (Jun. 12, 2005).

Hegazi, G.M. et al. "Linear Widerband VHF/UHF Quad LINC Transmitter System," IEEE Military Communications Conference (MILCOM), IEEE, pp. 1-6 (Oct. 29, 2007).

International Search Report for Patent Application No. PCT/IB2010/052159 (Aug. 25, 2010).

* cited by examiner

WCDMA Baseband signals in case of a conventional LINC signal separator.

WCDMA Baseband signals in case of a Quadrature signal separator.

QUAD LINC TRANSMITTER WITH SWITCHABLE CHIREIX AMPLIFIERS

FIELD

This invention relates to circuits for transmitters, and in particular, but not exclusively, to circuits for transmitters utilizing Chireix compensation.

DESCRIPTION OF RELATED ART

Transmitters typically include power amplifiers (PA), and there are several known ways to control a PA. One class of prior-art polar-modulation solution includes adding an amplitude modulation (AM) component via modulation of the supply voltage of the RF Power Amplifier. In order to be power efficient, this supply-voltage modulation should be done via an efficient switching DC-DC converter.

A second class of prior-art polar-modulation solution includes having the input of a switching PA driven with a two-level PWM (Pulse Width Modulation) signal that is generated by comparing the amplitude modulated and phase modulated carrier signal with a triangular (or saw-tooth) signal having a fundamental frequency that is at least twice the carrier frequency.

A third class of prior-art polar-modulation solution includes having the input of the switching PA driven with a two-level pulse-density signal that is generated by a band-pass sigma-delta modulator.

A fourth class of prior-art modulation solution includes having the transmitted signal generated with two out-phasing carriers, the so called linear amplification with non-linear components (LINC) architectures.

Power reduction in linear transmitters is very important, and one method to realize reduction of power is to make use of switching PAs such as class D and E amplifiers, which have good efficiency. In order to make use of switching PAs, suitable modulation methods including polar, pulse width modulation (PWM), pulse density modulation, and switched LINC can be used. However, decomposition of the complex baseband signal into auxiliary baseband signals that are used for generation of the desired constant envelope RF signals results in a large bandwidth expansion. This bandwidth expansion results in baseband in high sample frequencies and at RF in matching requirements of the two branches of the LINC transmitter.

Linear amplification using non-linear components (LINC) involves separately amplifying two constant envelope signal components using highly non-linear but very power efficient amplifiers.

The IEEE paper titled "Improved LINC power transmission using a quadrature out-phasing technique" by Gamal M. Hegazi, et al, IEEE MTT-S digest, pages 1923 to 1926, June 2005) discloses an approach to LINC power transmission based on a quadrature out-phasing technique, which depends on the constant envelope decomposition of the in-phase and quadrature parts of an input signal.

The listing or discussion of a prior-published document or any background in this specification should not necessarily be taken as an acknowledgement that the document or background is part of the state of the art or is common general knowledge. One or more aspects/embodiments of the present disclosure may or may not address one or more of the background issues.

BRIEF SUMMARY

According to a first aspect of the invention, there is provided a circuit for a transmitter configured to receive one or more input signals, comprising:

first and second Chireix compensation circuits; and
a switch configured to couple one or more Chireix input signals derived from the one or more input signals to either the first or second Chireix compensation circuits in accordance with a characteristic of the one or more input signals.

Using a plurality of Chireix compensation circuits can enable efficient processing, for example in terms of power consumption, to be performed. Different Chireix compensation circuits can be used to process the Chireix input signals in accordance with a characteristic/property of the input signals, and this can enable the Chireix compensated processing to be tailored for the characteristics of the input signals that are being processed, either directly or indirectly.

In some embodiments, the one or more Chireix input signals may be the same as the one or more input signals, and no pre-processing operations may be required to ensure that the format of the input signals are suitable for efficient Chireix compensated processing.

The characteristic of the one or more input signals may be the phase of the one or more input signals. For example, different Chireix compensated processing may be required for processing Chireix input signals derived from input signals having different phases.

In one embodiment, a first Chireix compensation circuit is required for processing signals derived from input signals having a phase in the range of 0° to 90°, and a second Chireix compensation circuit is required for processing signals derived from input signals having a phase in the range of 90° to 180°.

The first Chireix compensation circuit may comprise a first power amplifier, a second power amplifier, a Chireix inductor and a Chireix capacitor. The second Chireix compensation circuit may comprise a third power amplifier, a fourth power amplifier, a Chireix inductor and a Chireix capacitor. The first and second Chireix compensation circuits may be coupled to a load the opposite way round, for example in reverse bias relative to each other. Providing Chireix compensation circuits in this way may enable a consistent output signal to be provided independently of which Chireix compensation circuit is in use.

The same Chireix inductor and/or the same Chireix capacitor may be used for the first and second Chireix compensation circuits. Providing Chireix compensation circuits in this way can make efficient use of components that can be commonly used by a plurality of Chireix compensation circuits.

In some embodiments, the one or more input signals may comprise in-phase and quadrature real radio frequency (RF) envelope signals ($I_1$, $I_2$, $Q_1$, $Q_2$). In such examples, pre-processing may have been performed to provide input signals that are suitable for use as Chireix input signals.

In other embodiments, the one or more input signals may comprise real and imaginary baseband signals ($I_{1i}$, $I_{1q}$, $Q_{1i}$, $Q_{1q}$), and the circuit may further comprise a mixer unit configured to process the real and imaginary baseband signals ($I_{1i}$, $I_{1q}$, $Q_{1i}$, $Q_{1q}$) to generate the one or more Chireix input signals. The one or more Chireix input signals may comprise real radio frequency (RF) constant envelope signals ($I_1$, $I_2$, $Q_1$, $Q_2$).

The mixer unit may be considered as a pre-processing component configured to process the received input signals before Chireix compensated processing is performed. In some embodiments, it is the characteristics/properties of the input signal that are determinative as to how Chireix compensated processing should be efficiently performed.

The real and imaginary baseband signals may comprise one or more of: a real in-phase baseband signal ($I_{1i}$); an imaginary in-phase baseband signal ($I_{1p}$); a real quadrature baseband signal ($Q_{1i}$); and an imaginary quadrature baseband signal ($Q_{1q}$).

The real radio frequency (RF) envelope signals ($I_1$, $I_2$, $Q_1$, $Q_2$) may comprise one or more of a first in-phase constant baseband envelope signal ($I_{1i}+jI_{1q}$), a second in-phase constant baseband envelope signal ($I_{2i}+jI_{2q}$), a first quadrature constant baseband envelope signal ($Q_{1i}+jQ_{1q}$), and a second quadrature constant baseband envelope signal ($Q_{2i}+jQ_{2q}$).

In some embodiments, the one or more input signals may comprise an in-phase signal (I) and a quadrature signal (Q), and the circuit may further comprise a separator unit configured to process the in-phase and quadrature signals (I, Q) and generate real and imaginary baseband signals ($I_{1i}$, $I_{1q}$, $Q_{1i}$, $Q_{1q}$). The circuit may also comprise a mixer unit configured to process the real and imaginary baseband signals ($I_{1i}$, $I_{1q}$, $Q_{1i}$, $Q_{1q}$) to generate the one or more Chireix input signals. The one or more Chireix input signals may comprise real radio frequency (RF) constant envelope signals ($I_1$, $I_2$, $Q_1$, $Q_2$).

In such embodiments the separator unit and/or mixer unit may be considered as pre-processing components that are configured to process one or more input signals before Chireix compensated processing is performed.

The separator unit may be a quad LINC separator unit, and use of such a separator unit can provide for bandwidth efficient signal decomposition. This may be in addition to good power efficiency, as discussed above. In some embodiments, the output signals of the quad LINC separator unit may be well suited for adaptive Chireix compensated processing. For example, the maximum phase range of the in-phase and quadrature signals that are processed by the quad LINC separator unit may require different Chireix compensated processing using different Chireix compensation circuits depending upon the phase of the signals.

The circuit may further comprise third and fourth Chireix compensation circuits, and the first and second Chireix compensation circuits may be configured to process in-phase signals, and the third and fourth Chireix compensation circuits may be configured to process quadrature signals. In this way, one of the first and second Chireix compensation circuits may be used to adaptively process in-phase signals at any one time, and one of the third and fourth Chireix compensation circuits may be used to at any one time adaptively process quadrature signals. Such an embodiment may be useful in combination with a quad LINC separator unit.

A separator unit according to an embodiment of the invention may be configured to process original in-phase (I) and quadrature (Q) signals in order to generate the baseband signals $I_{1i}, I_{1q}, Q_{1i}, Q_{1q}$ that can used to generate four constant envelope signals. The signals $I_{1i}$ and $I_{1q}$ can be used to generate two RF constant envelope signals that together represent the original RF in-phase component (I). In the same way, the signals $Q_{1i}$ and $Q_{1q}$ can be used to generate two RF constant envelope signals that together represent the original RF quadrature component (Q). Characteristics of the original in-phase (I) and quadrature (Q) signals can used to control the states of the switches.

The separator unit may be configured to generate a first phase signal representative of the phase of the in-phase signal (I), and a second phase signal representative of the phase of the quadrature signal (Q). The first and/or second phase signals may be used to control operation of the switch for coupling the one or more Chireix input signals to a Chireix compensation circuit. In other embodiments, signals representative of any characteristic of the in-phase and quadrature signals may be used to control operation of the switch.

The circuit may further comprise:

a first switch operable in accordance with the first phase signal to connect or disconnect the first in-phase real radio frequency envelope signal ($I_1$) to the first Chireix compensation circuit;

a second switch operable in accordance with the first phase signal to connect or disconnect the second in-phase real radio frequency envelope signal ($I_2$) to the first Chireix compensation circuit;

a third switch operable in accordance with the first phase signal to connect or disconnect the first in-phase real radio frequency envelope signal ($I_1$) to the second Chireix compensation circuit;

a fourth switch operable in accordance with the first phase signal to connect or disconnect the second in-phase real radio frequency envelope signal ($I_2$) to the second Chireix compensation circuit;

a fifth switch operable in accordance with the second phase signal to connect or disconnect the first quadrature real radio frequency envelope signal ($Q_1$) to the third Chireix compensation circuit;

a sixth switch operable in accordance with the second phase signal to connect or disconnect the second quadrature real radio frequency envelope signal ($Q_2$) to the third Chireix compensation circuit;

a seventh switch operable in accordance with the second phase signal to connect or disconnect the first quadrature real radio frequency envelope signal ($Q_1$) to the fourth Chireix compensation circuit; and an eighth switch operable in accordance with the second phase signal to connect or disconnect the second quadrature real radio frequency envelope signal (Q.sub.2) to the fourth Chireix compensation circuit.

The first and second switches may be mutually exclusively operable with the third and fourth switches, and the fifth and sixth switches may be mutually exclusively operable with the seventh and eighth switches.

In this way, a plurality of switches can be used to provide adaptive Chireix compensated processing for signals derived from in-phase and quadrature input signals using, at any one time, two of four Chireix compensation circuits—one of two Chireix compensation circuits for each of an in-phase and quadrature branch of processing components.

According to a further aspect of the invention, there is provided a circuit for a transmitter comprising:

an in-phase branch of components and a quadrature branch of components;

wherein the in-phase branch is configured to receive first and second in-phase constant baseband envelope signals ($I_1$, $I_2$) and a first phase signal, and comprises:

first and second Chireix compensation circuits; and first switches configured to couple the first in-phase constant baseband envelope signal ($I_1$) and second in-phase constant baseband envelope signal ($I_2$) to either the first or second Chireix compensation circuits in accordance with the first phase signal; and wherein the quadrature branch is configured to receive first and second quadrature constant baseband envelope signals ($Q_1$, $Q_2$) and a second phase signal, and comprises:

third and fourth Chireix compensation circuits; and second switches configured to couple the first quadrature constant baseband envelope signal and second quadrature constant baseband envelope signal to either the third or fourth Chireix compensation circuits in accordance with the second phase signal.

A load output may be coupled to an output of the plurality of Chireix compensation circuits.

According to a further aspect of the invention, there is provided a transmitter comprising any circuit disclosed herein.

According to a further aspect of the invention, there is provided a method of performing Chireix compensated processing on one or more Chireix input signals derived from one or more input signals comprising:

coupling the one or more Chireix input signals to either a first or a second Chireix compensation circuit in accordance with a characteristic of the one or more input signals.

There may also be provided a computer program, which, when run on a computer, is configured to perform any method disclosed herein or configure a circuit, transmitter or any other apparatus disclosed herein.

The computer program may be provided on a computer readable medium such as a disc or a hard drive.

BRIEF DESCRIPTION

A description is now given, by way of example only, with reference to the accompanying drawings which:

DETAILED DESCRIPTION

One or more embodiments described herein relate to a circuit for a transmitter that comprises first and second Chireix compensation circuits. The circuit can also comprise at least one switch that is configured to couple an input signal, or signals derived from an input signal, to either the first Chireix compensation circuit or the second Chireix compensation circuit dependent upon the phase or another characteristic of the input signal. For example, the input signal may be capable of having a phase between 0° and 180°, and a first Chireix compensation circuit may be required when the phase of the input signal is between 0° and 90°, whereas a second Chireix compensation circuit may be required when the phase of the input signal is between 90° and 180°. Providing Chireix compensation in this way can provide a circuit with improved power efficiency compared with the prior art.

Embodiments described herein may provide advantages where the circuit receives in-phase and quadrature signals, or signals derived from in-phase and quadrature signals, as the input signals.

One or more embodiments described herein can be useful in combination with a LINC power transmission circuit based on a quadrature out-phasing technique. In this way, Chireix compensation can be efficiently performed over the whole phase range from 0° to 180° of the in-phase and quadrature signals.

Figure 1:
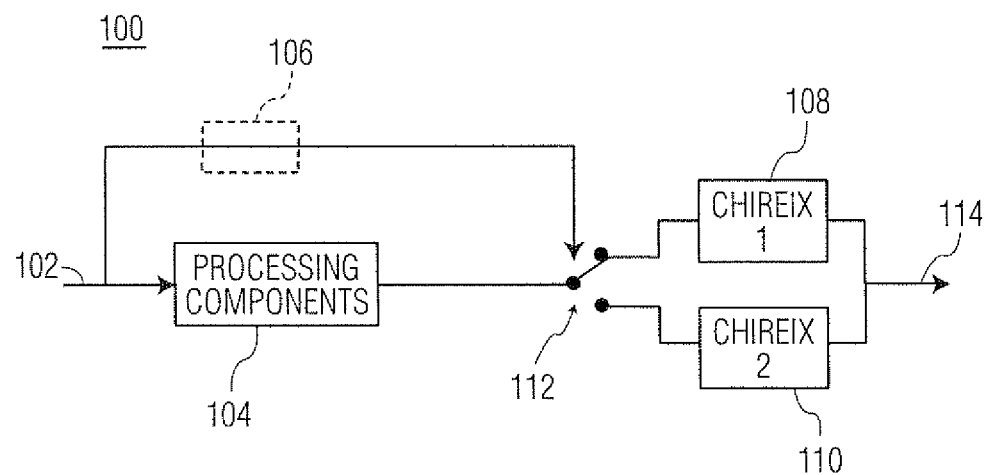
FIG. 1 illustrates a circuit according to an embodiment of the invention.

FIG. 1 illustrates schematically a circuit 100 for a transmitter according to an embodiment of the invention. The circuit 100 is configured to receive an input signal 102, which is encoded with information to be transmitted.

The circuit 100 can include one or more pre-processing components 104 for processing the received input signal 102 to generate Chireix input signals suitable for subsequent Chireix compensation processing. The one or more processing components 104 can include a separator and/or a mixer in order to generate signals that are suitable for Chireix compensation. In other embodiments, the received input signal 102 may be in a format that is suitable for Chireix compensation processing and therefore the one or more processing components 104 may not be required and the Chireix input signals may be the same as the received input signals.

In the embodiment of FIG. 1, the Chireix input signal, which is the output signal of the one or more processing components 104, is provided to a switch 112. The state of the switch 112 controls whether the Chireix input signal is coupled to a first Chireix compensation circuit 108 or a second Chireix compensation circuit 110. In this embodiment, the state of the switch 112 is controlled in accordance with a characteristic/property of the input signal 102, such as the phase of the input signal 102. A component 106 may be provided to process the input signal 102 in order to generate a switch control signal representative of one or more characteristics of the original signal 102 in order to control the state of the switch 112.

The switch 112 may be considered as an adaptive control, and in combination with the two Chireix compensation circuits 108, 110 may be considered as providing adaptive Chireix compensation.

The output signals of each of the two Chireix compensation circuits 108, 110 are connected to a common output line such that the output of the Chireix compensation circuit 108, 110 that is coupled to the processing components 104 provides the overall output 114 of the circuit 100 for the transmitter. In this way, a single output line can provide the output signal independent of which Chireix compensation circuit 108, 110 is in use.

It will be appreciated that in some embodiments, more than two Chireix compensation circuits may be provided and the selection of which of the Chireix compensation circuits are used can be made in accordance with any characteristic of any signal in the transmitter circuit.

Figure 2:
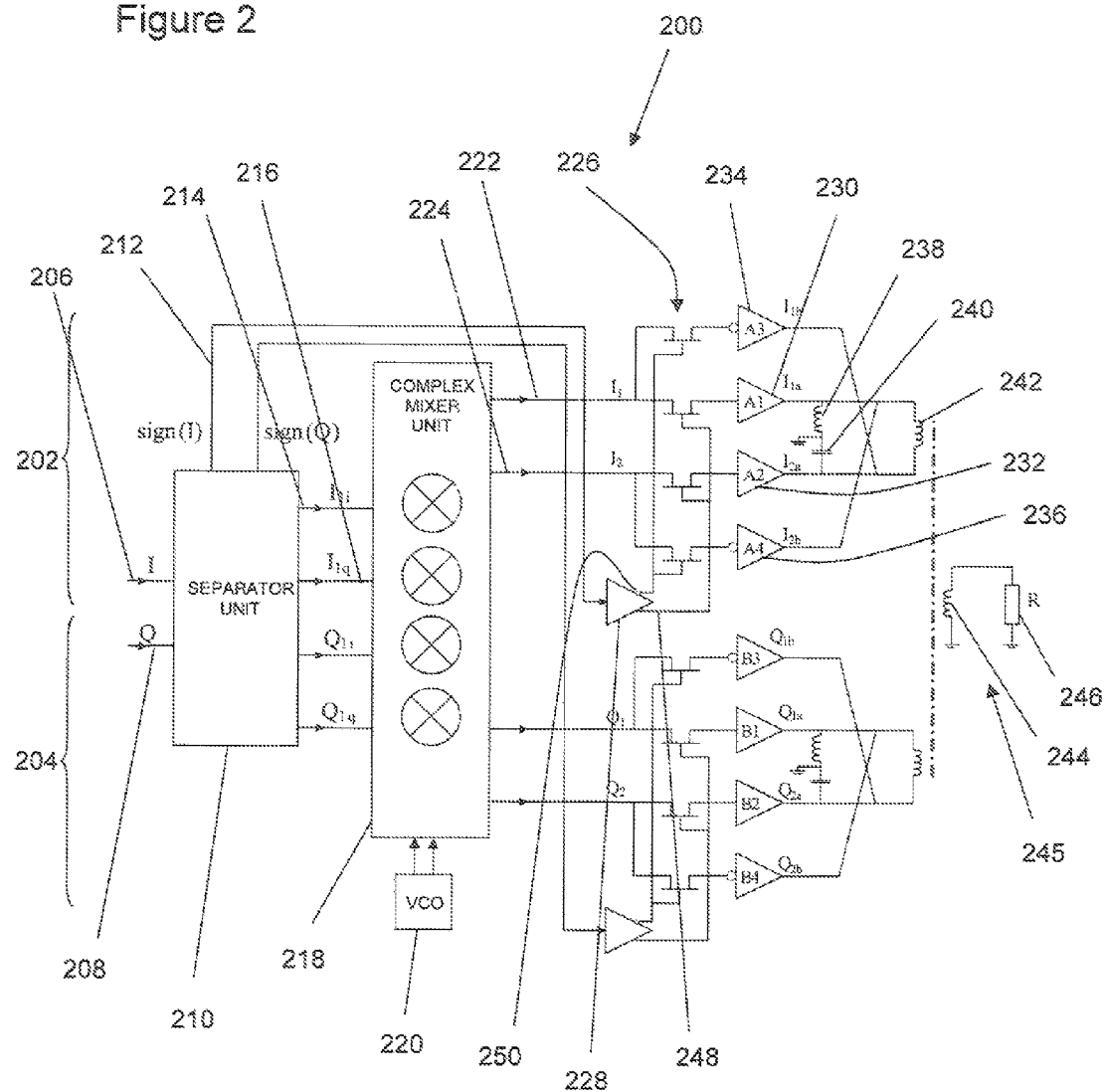
FIG. 2 illustrates a circuit according to another embodiment of the invention.

FIG. 2 illustrates a circuit 200 for a transmitter according to an embodiment of the invention. The circuit 200 receives an in-phase input signal 206 and a quadrature phase input signal 208. The two input signals 206, 208 may be considered as original or input signals. The circuit 200 can be considered to consist of components that process the in-phase input signal 206, and this is illustrated in FIG. 2 as "in-phase" branch components 202. The circuit 200 may also be considered to consist of "quadrature phase" branch components identified as reference 204 in FIG. 2. For simplicity, only the in-phase branch 202 will be described in detail, and it will be appreciated that the same and/or similar components are configured in the same way to perform similar processing for the quadrature branch 204.

The in-phase input signal 206 is received by a separator unit 210, which in this embodiment is a Quad LINC separator that generates two constant envelope signals for each of a received in-phase and quadrature input signal. The separator unit 210 is configured to process the received in-phase input signal 206 and generate a real and imaginary component signal 214, 216 of a constant baseband envelope signal $I_1$, wherein the real part of the constant baseband envelope signal is given reference $I_{1i}$ (214), and the imaginary part of the constant baseband envelope signal is given the reference $I_{1q}$ (216). Further details, including the mathematical operations, of this processing is provided below.

The real and imaginary parts of the constant baseband envelope signals $I_{1i}$ (214) and $I_{1q}$ (216), are provided as inputs to a complex mixer unit 218. Also provided as an input to the complex mixer unit is the output of a voltage controlled oscillator 220.

The complex mixer unit 218 is configured to process the constant baseband envelope signals $I_{1i}$ (214) and $I_{1q}$ (216) in order to generate first and second in-phase radio frequency (RF) signals $I_1$, $I_2$ 222, 224.

The first and second in-phase RF signals $I_1$, $I_2$ 222, 224 are each provided to two different switches 226, which are mutually exclusively operable. In this way, two of the switches 226 can be used to control which of two power amplifiers 230, 234 are used to process the first in-phase RF signal 222, and the other of the switches 226 are used to control which of another two power amplifiers 232, 236 are used to process the second in-phase RF signal 224.

When a switch is "on" it connects an in-phase RF signal 222, 224 to the input of an associated power amplifier 230, 232, 234, 236. When a switch is "off" it does not connect an in-phase RF signal 222, 224 to the input of the associated power amplifier 230, 232, 234, 236.

The power amplifiers 230, 232, 234, 236, along with other components, are used to perform Chireix compensation processing of the first and second in-phase RF signals $I_1$, $I_2$ 222, 224 as described below. In this embodiment, two of the power amplifiers 230, 232 can be used together to form part of a first Chireix compensation circuit, or the other two power amplifiers 234, 236 can be used together to form part of a second Chireix compensation circuit.

As will be described in more detail with reference to FIGS. 3a and 3b, the outputs of each of the four power amplifiers 230, 232, 234, 236 are connected to either a Chireix capacitor 240 or Chireix inductor 238 in order to perform Chireix compensation processing, and in this embodiment the Chireix capacitor 240 and Chireix inductor 238 are components that are used by both the first and second Chireix compensation circuits.

The outputs of the four power amplifiers 230, 232, 234, 236 are also connected to one of the pins of an output inductor 242 for coupling to a load 245 as described below.

In this example, the separator unit 210 is configured to process the original in-phase signal 206 and generate a phase signal 212 representative of the phase of the original in-phase signal 206. In this example, the phase signal 212 is a positive value when the phase of the original signal 206 is between 0° and 90° (that is, in the first or fourth quadrant), and is a negative value when the phase of the original signal 206 is between 90° and 180° (that is, in the second or third quadrant).

The phase signal output 212 is coupled to an input of a logic gate 228 that has an inverted output 250 and a non-inverted output 248. These two outputs can be used to mutually exclusively operate the four switches 226 so that only one Chireix compensation circuit is used at a time. The non-inverted output 248 is connected to two of the switches 226 that can couple the in-phase RF signals $I_1$, (222), $I_2$ (224) to the first and second power amplifiers 230, 232 respectively. The inverted output 250 is connected to the other two of the switches 226 that can couple the in-phase RF signals $I_1$ (222), $I_2$ (224) to the third and fourth power amplifiers 234, 236 respectively. In this way, the in-phase RF signals $I_1$ (222), $I_2$ (224) are coupled to the first and second power amplifiers 230, 232 but not the third and fourth power amplifiers 234, 236 when the phase signal 212 is negative. Similarly, the in-phase RF signals $I_1$ (222), $I_2$ (224) are coupled to the third and fourth power amplifiers 234, 236 but not the first and second power amplifiers 230, 232 when the phase signal 212 is positive.

Figure 3A:
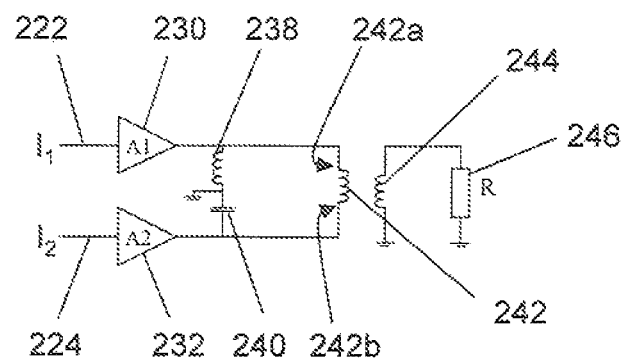
FIGS. 3a and 3b illustrate Chireix compensation circuits according to an embodiment of the invention.

Referring now to FIG. 3a, which illustrates the first Chireix compensation circuit, only the components of the Chireix compensation circuit that are in use when the phase of the original signal 206 is between 0° and 90° (first or fourth quadrant) are shown in order to aid clarity. As discussed above, which components are in use depends upon the state of the switches 226.

The first in-phase RF signal I.sub.1 is coupled to the first power amplifier 230 and the second in-phase RF signal I.sub.2 is coupled to the second power amplifier 232.

The output of the first power amplifier 230 is connected in parallel to a first pin of a Chireix inductor 238 and also to a first pin 242a of an output inductor 242. The second pin of the Chireix inductor 238 is connected to ground.

The output of the second power amplifier 232 is connected in parallel to a first plate of a Chireix capacitor 240 and also to a second pin 242b of the output inductor 242. The second plate of the Chireix capacitor 240 is connected to ground.

Operation of the Chireix capacitor 240 and Chireix inductor 238 to cancel out the reactive part of the load is described below in relation to FIGS. 16 to 19. It will be appreciated that the output inductor 242 of the Chireix compensation circuit is coupled to a load 245, and more particularly inductively coupled to a load inductor 244.

Figure 3B:
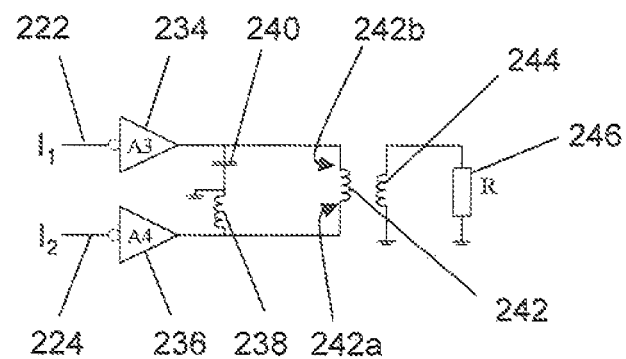

Referring now to FIG. 3b, which illustrates the second Chireix compensation circuit, only the components of the Chireix compensation circuit that are in use when the phase of the original signal 206 is between 90° and 180° (second or third quadrant) are shown in order to aid clarity.

As will be described below, the same Chireix inductor 238 and Chireix capacitor 240 are used, but with different power amplifiers 234, 236. In this way, the Chireix inductor 238 and Chireix capacitor 240 and the output inductor 242 are connected to the RF signals $I_1$ and/or $I_2$ as part of both the first and second Chireix compensation circuits. The Chireix capacitor 240 and Chireix inductor 238 are connected to the opposite RF signals ($I_1$, $I_2$) as part of the different Chireix compensation circuits, and the output inductor is connected the opposite way around.

For the second Chireix compensation circuit shown in FIG. 3b, the first in-phase RF signal $I_1$ is coupled to the third power amplifier 234 and the second in-phase RF signal $I_2$ is coupled to the fourth power amplifier 236. In this example, the third and fourth amplifiers 234, 236 are inverting amplifiers in order to generate a consistent output signal irrespective of which Chireix compensation circuit is in use.

The output of the third power amplifier 234 is connected in parallel to the first plate of the Chireix capacitor 240 and also to the second pin 242b of the output inductor 242. The second pin of the Chireix capacitor 240 is connected to ground.

The output of the fourth power amplifier 236 is connected in parallel to a first pin of the Chireix inductor 238 and also to the first pin 242a of the output inductor 242. The second pin of the Chireix inductor 238 is connected to ground.

The above described circuit 200 enables Chireix compensation processing to be efficiently performed on signals generated by a Quad LINC separator unit 210. In this way, one or more Chireix input signals can be coupled to either a first or second Chireix compensation circuit in accordance with a characteristic of an input signal.

There now follows a detailed description of components/circuits that can be used in embodiments of the invention, along with a mathematical analysis of signals that are processed by the components/circuits as appropriate.

Baseband Separator Unit with RF Conversion

Bandwidth Considerations for a LINC Transmitter

Known linear amplification with non-linear components (LINC) transmitter systems separate a source signal (s(t)) into two constant envelope component signals represented by $S_1(t)$ and $S_2(t)$:

$$\overline{S}_1(t) = e^{j(\omega t + \theta_P(t) + \theta_M(t))}$$

$$\overline{S}_2(t) = e^{j(\omega t + \theta_P(t) + \theta_M(t))} \quad (1)$$

Figure 4:
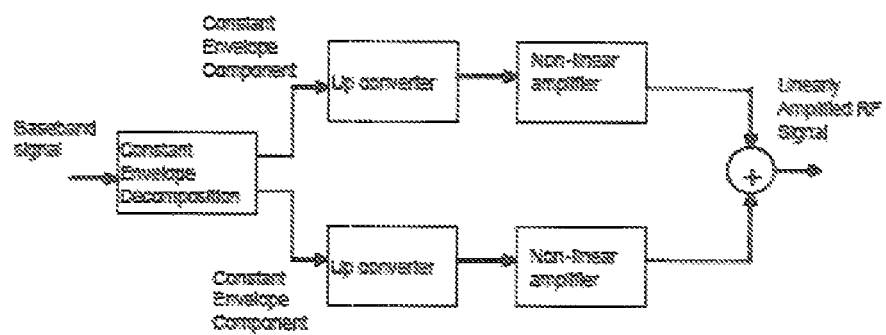
FIG. 4 illustrates schematically an exemplary LINC transmitter system.

An exemplary LINC transmitter system is shown as FIG. 4, where it can be seen that the amplified components are then combined at high power levels, resulting in a desired linearly amplified signal.

For the phase difference of the constant envelope signals and the desired signal we get:

$$\theta_M(t) = \text{acr} \cos(A(t)/2) \quad (2)$$

The expressions above can further be simplified:

$$\overline{S}_1(t) = e^{j(\omega t + \theta_P(t))} \{A(t)/2 + j\sqrt{4 - A(t)^2}/2\}$$

$$\overline{S}_2(t) = \overline{s}(t) + e^{j(\omega t + \theta_P(t))}\sqrt{1 - A(t)^2/4} \quad (3)$$

Taylor expansion of the square root term for both constant envelope signals gives:

$$\overline{S}_1(t) = \tfrac{1}{2}\overline{s}(t) + je^{j(\omega t + \theta_P(t))}(1 - \tfrac{1}{8}A(t)^2 - \tfrac{1}{128}A(t)^4 - \tfrac{1}{1024}A(t)^6 \ldots)$$

$$\overline{S}_2(t) = \tfrac{1}{2}\overline{s}(t) + je^{j(\omega t + \theta_P(t))}(1 - \tfrac{1}{8}A(t)^2 - \tfrac{1}{128}A(t)^4 - \tfrac{1}{1024}A(t)^6 \ldots) \quad (4)$$

The bandwidth of the envelope A(t) and the phase signal $\theta_P$ will be larger than the bandwidth of the original signal given by s(t). The above equations show that both constant envelope signals ($S_1(t)$ and $S_2(t)$) can be split in two separate parts: the first part of $S_1$ and $S_2$ (½ s(t)) is a weighted replica of the original source signal s(t) with the original bandwidth $B_w$; and the second parts are a multiplication of a phase modulated signal and a series formed by harmonics of the envelope A(t). The second part has a larger bandwidth than the original signal s(t).

For an ideal LINC transmitter, the terms of the second parts of equations (4) will cancel each other out, resulting in signals with the original bandwidth. However, in practice, a mismatch between both signal paths will result in a distorted wanted signal and a noisy out-band spectrum and therefore both constant envelope signals ($S_1(t)$ and $S_2(t)$) do have a larger bandwidth than the original signal.

Bandwidth of Complex Baseband Signals of a LINC Modulator

The bandwidth increment of the RF LINC signals $S_1$ and $S_2$ was discussed in the previous section. The generation of these signals can be performed with a digital baseband unit and a complex RF converter. Decomposition of the original baseband signals into the baseband signals $I_1$, $I_2$, $Q_1$, and $Q_2$ will also result in a bandwidth increase of these baseband signals. The latter means a higher sample frequency in the digital baseband domain.

Figure 5A:
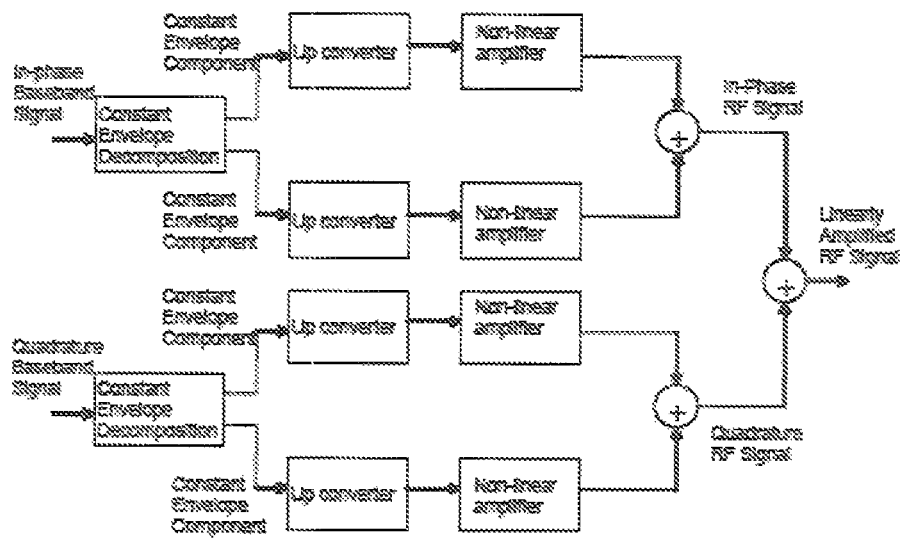
FIG. 5a illustrates schematically an exemplary quadrature LINC separator.

An exemplary quadrature LINC separator block diagram is shown as FIG. 5a. The quadrature LINC separation approach first separates the in-phase and quadrature components of the complex baseband signal. In this way, both the in-phase and quadrature signals become real and can be decomposed into four constant envelope components that are provided as outputs of two constant envelope decomposition blocks as shown in FIG. 5a.

Figure 5B:
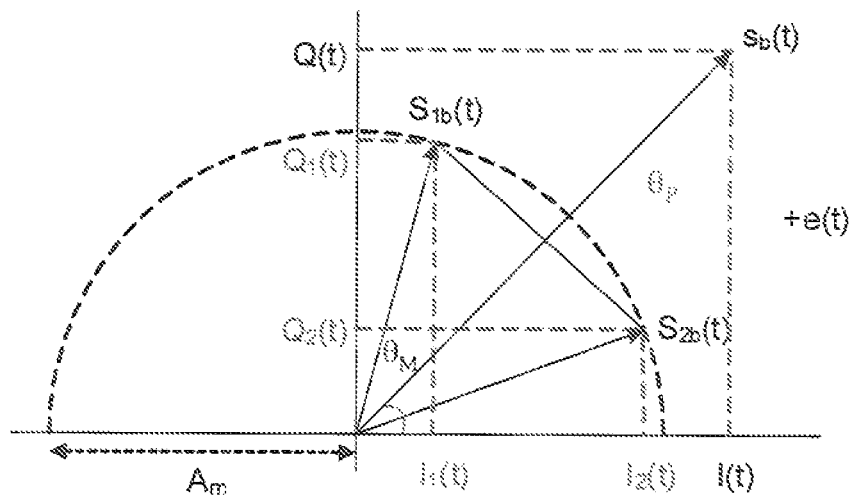
FIG. 5b shows a vector diagram for the separator of FIG. 4.

The vector diagram of FIG. 5b shows the decomposition of the two complex LINC signals $S_{1b}$ and $S_{2b}$ into the real baseband signals $I_1$, $I_2$, $Q_1$, and $Q_2$.

Figure 6:
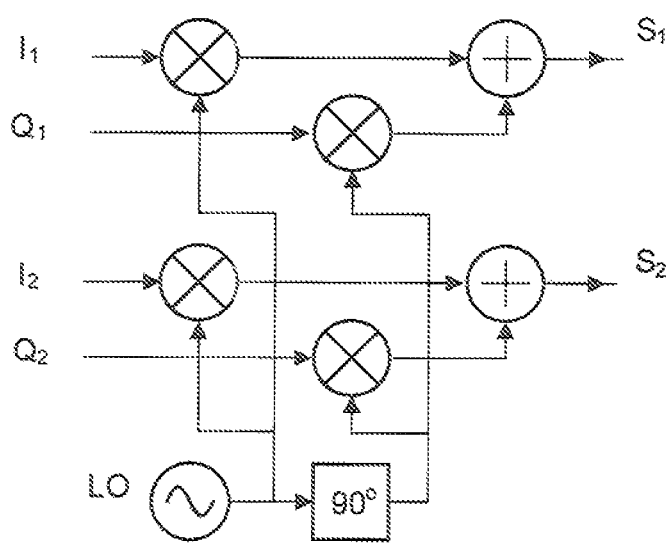
FIG. 6 illustrates a complex up-converter.

FIG. 6 shows a complex up-converter that can be used to generate the two RF LINC signals from the baseband signals of the digital baseband unit.

For the complex baseband signal we can write the following equation:

$$\overline{s}_b = I + jQ = \overline{S}_{1b} + \overline{S}_{2b} = [I_1 + jQ_1] + [I_2 + jQ_2] \quad (5)$$

The transmitted RF carrier is given by:

$$s(t) = Re\{\overline{s}_b \cdot e^{j\omega_c t}\} \quad (6)$$

For convenience and to improve the clarity of the equations, the time t will be omitted from all time dependent variables.

$$s = Re\{(I + jQ)e^{j\omega_c t}\} = I\cos(\omega_c t) - Q\sin(\omega_c t) \quad (7)$$

For the RF LINC signals can be written:

$$S_1 = Re\{(I_1 + jQ_1)e^{j\omega_c t}\} = I_1\cos(\omega_c t) - Q_1\cos(\omega_c t)$$

$$S_2 = Re\{(I_2 + jQ_2)e^{j\omega_c t}\} = I_2\cos(\omega_c t) - Q_2\cos(\omega_c t) \quad (8)$$

As shown above, the LINC signals $S_1$ and $S_2$ have a larger bandwidth than the original I and Q signals, and this means that at least one of the $I_{1,2}$ or $Q_{1,2}$ signals also have this large bandwidth.

$$S = S_1 + S_2 = (I_1 + I_2)\cos(\omega_c t) - (Q_1 + Q_2)\sin(\omega_c t) \quad (9)$$

The modulus of $S_1$ and $S_2$ are time independent and given by:

$$|\overline{S}_1| = |\overline{S}_2| = A_m \quad (10)$$

As can be seen from FIG. 5, we can write:

$$I_1 = A_m \cos(\theta_P + \theta_M)$$

$$Q_1 = A_m \sin(\theta_P + \theta_M)$$

$$I_2 = A_m \cos(\theta_P - \theta_M)$$

$$Q_2 = A_m \sin(\theta_P - \theta_M) \quad (11)$$

Combining results into:

$$s = +2A_m\cos(\theta_P)\cos(\theta_M)\cos(\omega_c t) - 2A_m\sin(\theta_P)\cos(\theta_M)\sin(\omega_c t) \quad (12)$$

Comparing the signal above with an earlier relation of s(t) results in the following relationship between the original I and Q signal with the phases $\theta_M$, $\theta_P$ and the amplitude $A_m$ of the signals in the LINC branches:

$$I = \underbrace{+2A_m\cos(\theta_P)\cos(\theta_M)}_{\text{Bandwidth } B_T/2} \quad (13)$$

$$Q = \underbrace{+2A_m\sin(\theta_P)\cos(\theta_M)}_{\text{Bandwidth } B_T/2}$$

As can be seen from equation (13), both I and Q have the bandwidth of the original baseband signal $B_T/2$ from which it can be concluded that also the products of the sine and cosine terms have the same bandwidth.

Splitting the signals in an envelope and phase modulating the signals results in two signals with a much larger bandwidth than the original bandwidth $B_T/2$:

$$s = +2A_m \cos(\theta)[\cos(\theta_P)\cos(\omega_c t) - \sin(\theta_P)\sin(\omega_c t)] + 2A_m \cos(\theta_M) Re[e^{j\theta_P} e^{j\omega_c t}] \quad (14)$$

The I and Q components of the original signal s are given by:

$$I = I_1 + I_2 = +2A_m \cos(\theta_P)\cos(\theta_M)$$

$$Q = Q_1 + Q_2 = +2A_m \sin(\theta_P)\cos(\theta_M) \quad (15)$$

Using equations (11) and (13), the quadrature components of the constant envelope signals, $I_1$, $I_2$, $Q_1$, and $Q_2$ can be written as:

$$I_1 = A_m(\cos(\theta_P)\cos(\theta_M) - \sin(\theta_P)\sin(\theta_M)) \quad (16\text{-}19)$$
$$= \frac{I}{2} - A_m \sin(\theta_P)\sin(\theta_M)$$

$$Q_1 = A_m(\sin(\theta_P)\cos(\theta_M) + \cos(\theta_P)\sin(\theta_M))$$
$$= \frac{Q}{2} + A_m \cos(\theta_P)\sin(\theta_M)$$

$$I_2 = A_m(\cos(\theta_P)\cos(\theta_M) + \sin(\theta_P)\sin(\theta_M))$$
$$= \frac{I}{2} + A_m \sin(\theta_P)\sin(\theta_M)$$

$$Q_2 = A_m(\sin(\theta_P)\cos(\theta_M) - \cos(\theta_P)\sin(\theta_M))$$
$$= \frac{Q}{2} - A_m \cos(\theta_P)\sin(\theta_M)$$

For the separate terms in equations (16) to (19) we can write:

$$\cos(\theta_M) = \frac{|\bar{s}|}{2A_m} \quad (20)$$

$$\sin(\theta_M) = \sqrt{1 - \left(\frac{|\bar{s}|}{2A_m}\right)^2}$$
$$= 1 - \frac{1}{8}\left(\frac{|\bar{s}|}{A_m}\right)^2 - \frac{1}{128}\left(\frac{|\bar{s}|}{A_m}\right)^4 - \frac{1}{1024}\left(\frac{|\bar{s}|}{A_m}\right)^6$$

$$\cos(\theta_P) = \frac{Q}{|\bar{s}|}$$

$$\sin(\theta_P) = \frac{I}{|\bar{s}|}$$

$$|\bar{s}| = \sqrt{I^2 + Q^2}$$

Substitution of the expressions shown as equation (20) into the equations of (16) to (19) results in:

$$I_1 = A_m(\cos(\theta_P)\cos(\theta_M) - \sin(\theta_P)\sin(\theta_M)) \quad (21\text{-}24)$$
$$= \frac{I}{2} - I\left(1 - \frac{1}{8}\left(\frac{|\bar{s}|}{A_m^2}\right) - \frac{1}{128}\left(\frac{|\bar{s}|^3}{A_m^4}\right) - \frac{1}{1024}\left(\frac{|\bar{s}|^5}{A_m^6}\right)\right)$$

$$Q_1 = A_m(\sin(\theta_P)\cos(\theta_M) + \cos(\theta_P)\sin(\theta_M))$$
$$= \frac{Q}{2} + Q\left(1 - \frac{1}{8}\left(\frac{|\bar{s}|}{A_m^2}\right) - \frac{1}{128}\left(\frac{|\bar{s}|^3}{A_m^4}\right) - \frac{1}{1024}\left(\frac{|\bar{s}|^5}{A_m^6}\right)\right)$$

-continued $$I_2 = A_m(\cos(\theta_P)\cos(\theta_M) + \sin(\theta_P)\sin(\theta_M))$$
$$= \frac{I}{2} + I\left(1 - \frac{1}{8}\left(\frac{|\bar{s}|}{A_m^2}\right) - \frac{1}{128}\left(\frac{|\bar{s}|^3}{A_m^4}\right) - \frac{1}{1024}\left(\frac{|\bar{s}|^5}{A_m^6}\right)\right)$$

$$Q_2 = A_m(\sin(\theta_P)\cos(\theta_M) - \cos(\theta_P)\sin(\theta_M))$$
$$= \frac{Q}{2} - Q\left(1 - \frac{1}{8}\left(\frac{|\bar{s}|}{A_m^2}\right) - \frac{1}{128}\left(\frac{|\bar{s}|^3}{A_m^4}\right) - \frac{1}{1024}\left(\frac{|\bar{s}|^5}{A_m^6}\right)\right)$$

An analysis of equations (20) to (24) in the frequency domain by means of convolution shows spectrum convolutions of the I (or Q) signal with convolutions of the envelope. This means also a large increase in bandwidth for the baseband signals.

Figure 7:
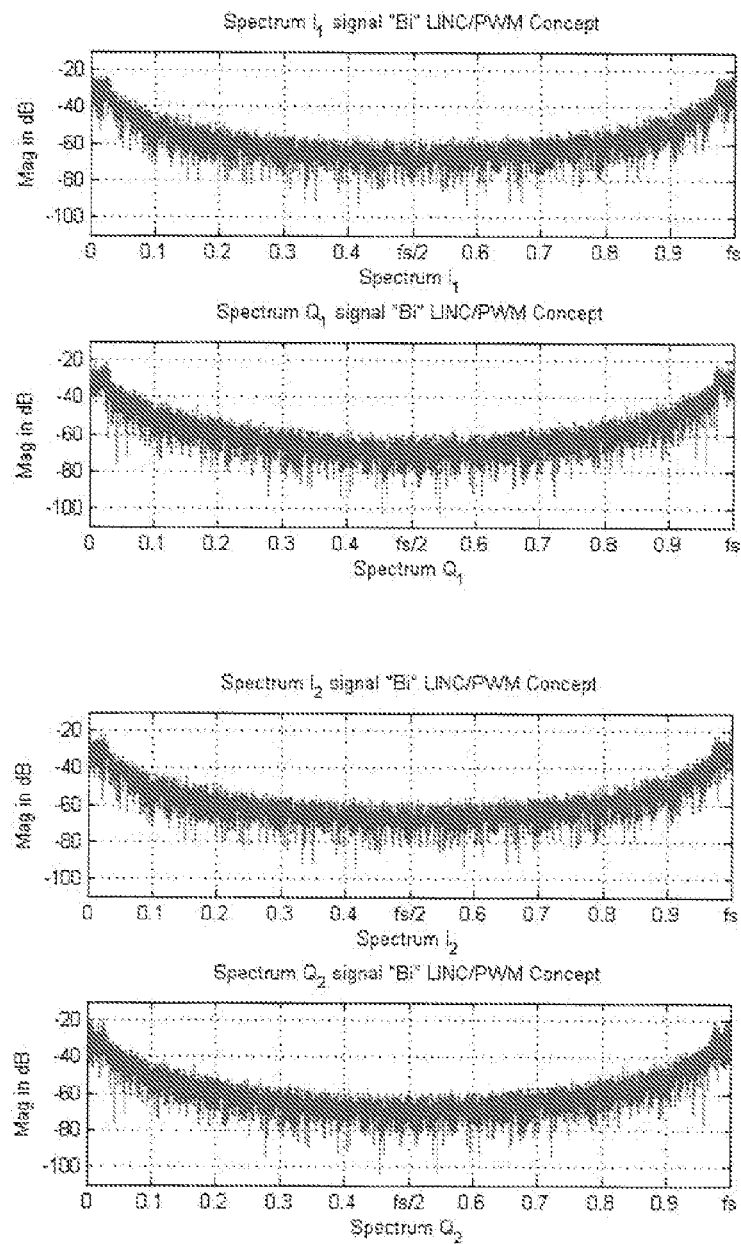
FIGS. 7 to 9 show the results of simulations.
Figure 8:
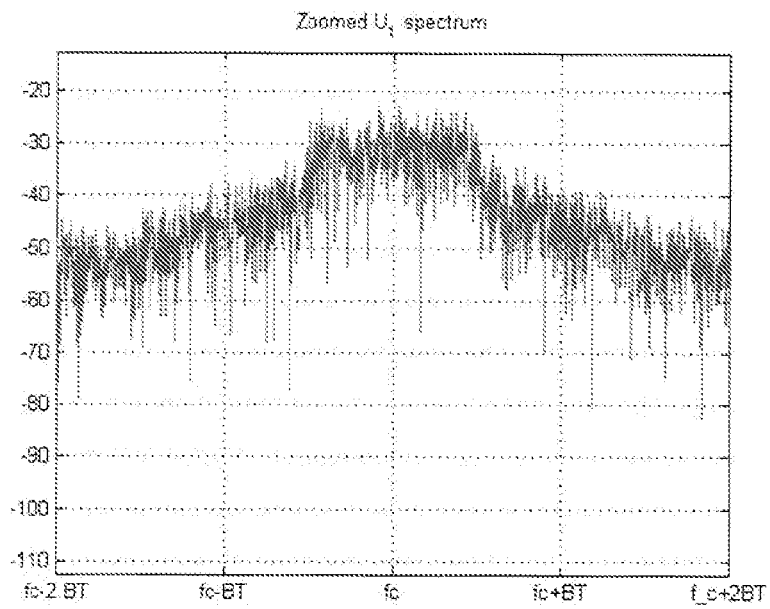
Figure 9:
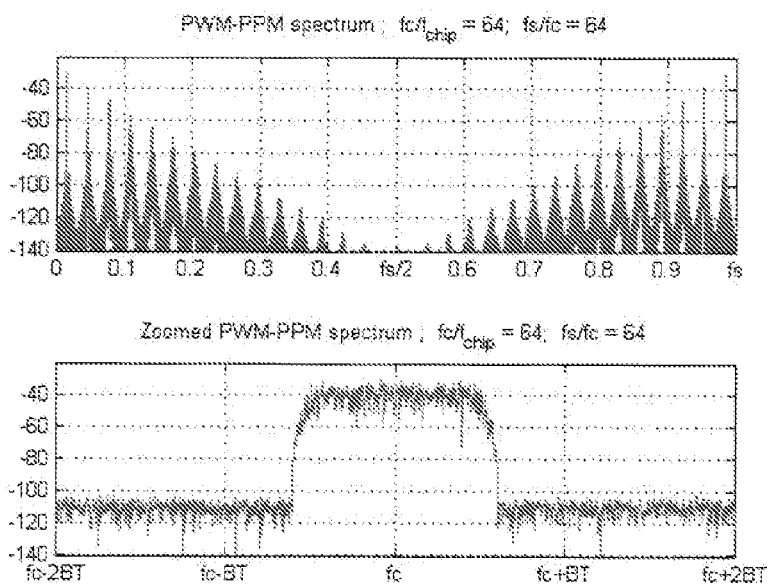

FIGS. 7, 8 and 9 show simulations illustrative of the increase in bandwidth in baseband and in the LINC branches. (Oversampling WCDMA 16.times.). After combining the switched LINC branches we see the original transmitted RF WCDMA signal.

Bandwidth Consideration Quadrature Out-Phasing Technique

Figure 10:
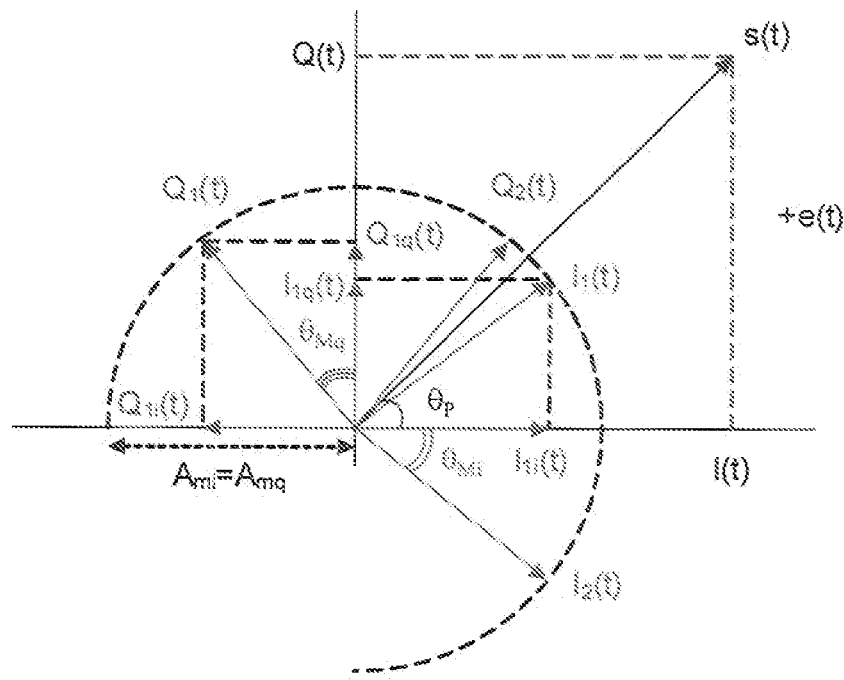
FIG. 10 shows a vector diagram for a quadrature out-phasing technique.

FIG. 10 shows a vector diagram of signals generated by a Quadrature out-phasing technique.

The time variable t is left out in the equations in order to provide more clear equations.

The complex baseband signal for transmission is:

$$\bar{s}_{base} = I + jQ \quad (25)$$

The transmitted signal is:

$$s = Re[(\bar{s}_{base})e^{j\omega_c t}] = I\cos(\omega_c t) - Q\sin(\omega_c t) \quad (26)$$

In this embodiment, the I and the Q baseband components can be split up into two constant envelope signals. Replacing the I and Q signals in the equation above by the constant envelope signals $I_1$, $I_2$, $Q_1$, and $Q_2$ gives:

$$I = \bar{I}_1 + \bar{I}_2$$

$$Q = \bar{Q}_1 + \bar{Q}_2 \quad (27)$$

Resulting into the following complex baseband signal equation:

$$\bar{s}_{base} = (\bar{I}_1 + \bar{I}_2) + j(\bar{Q}_1 + \bar{Q}_2) \quad (28)$$

For the transmitted signal we can write:

$$s = Re[\bar{s}] = Re[((\bar{I}_1 + \bar{I}_2) + j(\bar{Q}_1 + \bar{Q}_2))e^{j\omega_c t}] \quad (29)$$

The real and imaginary parts of the constant baseband envelope signals $I_1$ and $Q_1$ are given by:

$$I_{1i} = Re(\bar{I}_1) = Re(A_{mi}e^{j\theta_{Mi}}) = +A_{mi}\cos(\theta_{Mi})$$

$$I_{1q} = Im(\bar{I}_1) = Im(A_{mi}e^{j\theta_{Mi}}) = +A_{mi}\sin(\theta_{Mi})$$

$$Q_{1i} = Re(\bar{Q}_1) = Re(A_{mq}e^{j\theta_{Mq}}) = +A_{mi}\sin(\theta_{Mq})$$

$$Q_{1q} = Im(\bar{Q}_1) = Im(A_{mq}e^{j\theta_{Mq}}) = +A_{mi}\cos(\theta_{Mq}) \quad (30)$$

And their relation with the real and imaginary components of the constant envelope signals $I_2$ and $Q_2$ is given by:

$$I_{1i} = I_{2i}, I_{1q} = -I_{2q}$$

$$Q_{1i} = -Q_{2i}, Q_{1q} = Q_{2q} \quad (31)$$

With the aid of the vector diagram of FIG. 10, the following equations can be derived:

$$\cos(\theta_{Mi}) = \frac{I}{2A_{mi}} \quad \sin(\theta_{Mi}) = \sqrt{1 - \frac{I^2}{4A_{mi}^2}} \quad (32)$$

$$\cos(\theta_{Mq}) = \frac{Q}{2A_{mq}} \quad \sin(\theta_{Mq}) = \sqrt{1 - \frac{Q^2}{4A_{mq}^2}}$$

The complex constant envelope signals can be written as:

$$\bar{I}_1 = (I_{1i} + jI_{1q})e^{j(\omega_c t)}$$

$$\bar{I}_2 = (I_{2i} + jI_{2q})e^{j(\omega_c t)}$$

$$\bar{Q}_1 = (Q_{1i} + jQ_{1q})e^{j(\omega_c t)}$$

$$\bar{Q}_2 = (Q_{2i} + jQ_{2q})e^{j(\omega_c t)} \quad (33)$$

The equations for the real constant envelope signals are:

$$I_1 = Re(\bar{I}_1) = I_{1i}\cos(\omega_c t) - I_{1q}\sin(\omega_c t)$$

$$I_2 = Re(\bar{I}_2) = I_{2i}\cos(\omega_c t) - I_{2q}\sin(\omega_c t)$$

$$Q_1 = Re(\bar{Q}_1) = Q_{1i}\cos(\omega_c t) - Q_{1q}\sin(\omega_c t)$$

$$Q_2 = Re(\bar{Q}_2) = Q_{2i}\cos(\omega_c t) - Q_{2q}\sin(\omega_c t) \quad (34)$$

Substitution of earlier derived relations results in:

$$I_1 = Re(\bar{I}_1) = \frac{I}{2}\cos(\omega_c t) - A_{mi}\sqrt{1 - \frac{I^2}{4A_{mi}^2}}\sin(\omega_c t) \quad (35)$$

$$I_2 = Re(\bar{I}_2) = \frac{I}{2}\cos(\omega_c t) + A_{mi}\sqrt{1 - \frac{I^2}{4A_{mi}^2}}\sin(\omega_c t)$$

$$Q_1 = Re(\bar{Q}_1) = -A_{mq}\sqrt{1 - \frac{Q^2}{4A_{mq}^2}}\cos(\omega_c t) - \frac{Q}{2}\sin(\omega_c t)$$

$$Q_2 = Re(\bar{Q}_2) = -A_{mq}\sqrt{1 - \frac{Q^2}{4A_{mq}^2}}\cos(\omega_c t) + \frac{Q}{2}\sin(\omega_c t)$$

The relations above are used to construct the block diagram which generates the four real constant RF envelope signals from 4 real baseband signals. This can also be written as:

$$I_1 = Re(\bar{I}_1) = A_{mi}(+\cos(\theta_{Mi})\cos(\omega_c t) - \sin(\theta_{Mi})\sin(\omega_c t))$$

$$I_2 = Re(\bar{I}_2) = A_{mi}(+\cos(\theta_{Mi})\cos(\omega_c t) + \sin(\theta_{Mi})\sin(\omega_c t))$$

$$Q_1 = Re(\bar{Q}_1) = A_{mq}(-\sin(\theta_{Mq})\cos(\omega_c t) - \cos(\theta_{Mq})\sin(\omega_c t))$$

$$Q_2 = Re(\bar{Q}_2) = A_{mq}(+\sin(\theta_{Mq})\cos(\omega_c t) - \cos(\theta_{Mq})\sin(\omega_c t)) \quad (36)$$

Further simplification results in:

$$I_1 = Re(\bar{I}_1) = +A_{mi}\cos(\omega_c t + \theta_{Mi}) \quad (37\text{-}40)$$

$$I_2 = Re(\bar{I}_2) = +A_{mi}\cos(\omega_c t - \theta_{Mi})$$

$$Q_1 = Re(\bar{Q}_1) = -A_{mq}\sin(\omega_c t + \theta_{Mq})$$

$$Q_2 = Re(\bar{Q}_2) = -A_{mq}\sin(\omega_c t - \theta_{Mq})$$

-continued $$\bar{I}_1(t) = A_{mi}e^{j(\omega_c t)}e^{j\theta_{Mi}(t)} = A_{mi}e^{j(\omega_c t)}\{\cos(\theta_{Mi}(t)) + j\sin(\theta_{Mi}(t))\}$$

$$\bar{I}_1(t) = e^{j(\omega_c t)}\left\{\frac{I(t)}{2} + jA_{mi}\sqrt{1 - \frac{I(t)^2}{4A_{mi}^2}}\right\}$$

$$\bar{I}_2(t) = A_{mi}e^{j(\omega_c t)}e^{-j\theta_{Mi}(t)} = A_{mi}e^{j(\omega_c t)}\{\cos(\theta_{Mi}(t)) - j\sin(\theta_{Mi}(t))\}$$

$$\bar{I}_2(t) = e^{j(\omega_c t)}\left\{\frac{I(t)}{2} - jA_{mi}\sqrt{1 - \frac{I(t)^2}{4A_{mi}^2}}\right\}$$

$$\bar{I}_1(t) = e^{j(\omega_c t)}\left(\frac{I(t)}{2} + jA_{mi}\left(1 - \frac{1}{8}\left(\frac{I(t)}{A_{mi}}\right)^2 - \frac{1}{128}\left(\frac{I(t)}{A_{mi}}\right)^4 - \frac{1}{1024}\left(\frac{I(t)}{A_{mi}}\right)^6 \ldots\right)\right)$$

$$\bar{I}_2(t) = e^{j(\omega_c t)}\left(\frac{I(t)}{2} - jA_{mi}\left(1 - \frac{1}{8}\left(\frac{I(t)}{A_{mi}}\right)^2 - \frac{1}{128}\left(\frac{I(t)}{A_{mi}}\right)^4 - \frac{1}{1024}\left(\frac{I(t)}{A_{mi}}\right)^6 \ldots\right)\right)$$

Equation (40) shows that the bandwidth of the out-phasing signals $I_1$, $I_2$, $Q_1$, and $Q_2$ in comparison with the original I and Q signals will increase. However, spectrum extension is now a function of the harmonics of the original I and Q baseband quadrature signals and not a function of the phase modulation or envelope of the original signal s(t) as was the case for the LINC transmitter under consideration in equations (21) to (24). This results in less bandwidth expansion of the generated out-phasing signals.

The signals $I_1$ and $I_2$ are now a function of I(t) and not |s| as was the case in equations (21) to (24).

In this example, to overcome spectrum expansion of the transmitted signal it is also important that there is sufficient matching between the constant envelope signals. For the quadrature out-phasing system, the matching requirements will be lower because of the reduced bandwidth of the generated constant envelope signals. The main distortion products will be produced in the channel itself and both adjacent channels, although the Adjacent Channel Power Ratio (ACPR) requirements are more relaxed for the adjacent channels.

Figure 11:
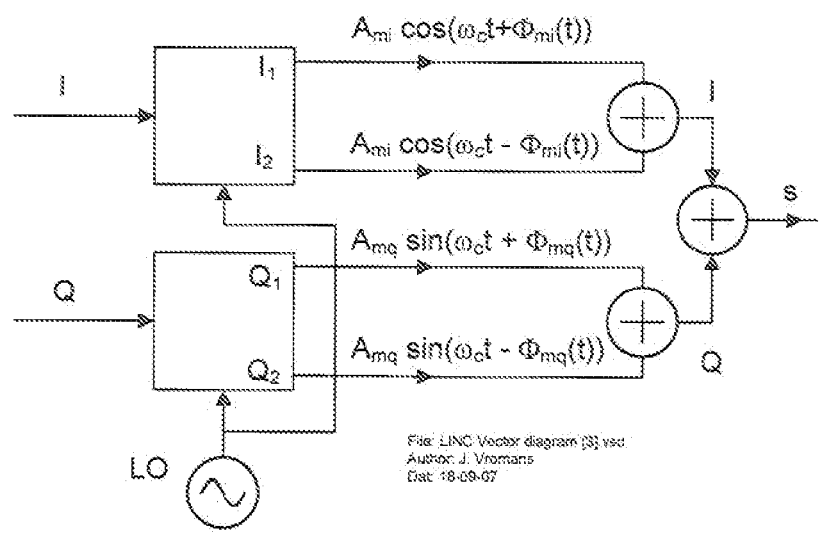
FIG. 11 illustrates schematically a quadrature out-phasing block diagram.

FIG. 11 shows the final quadrature out-phasing block diagram.

Figure 12:
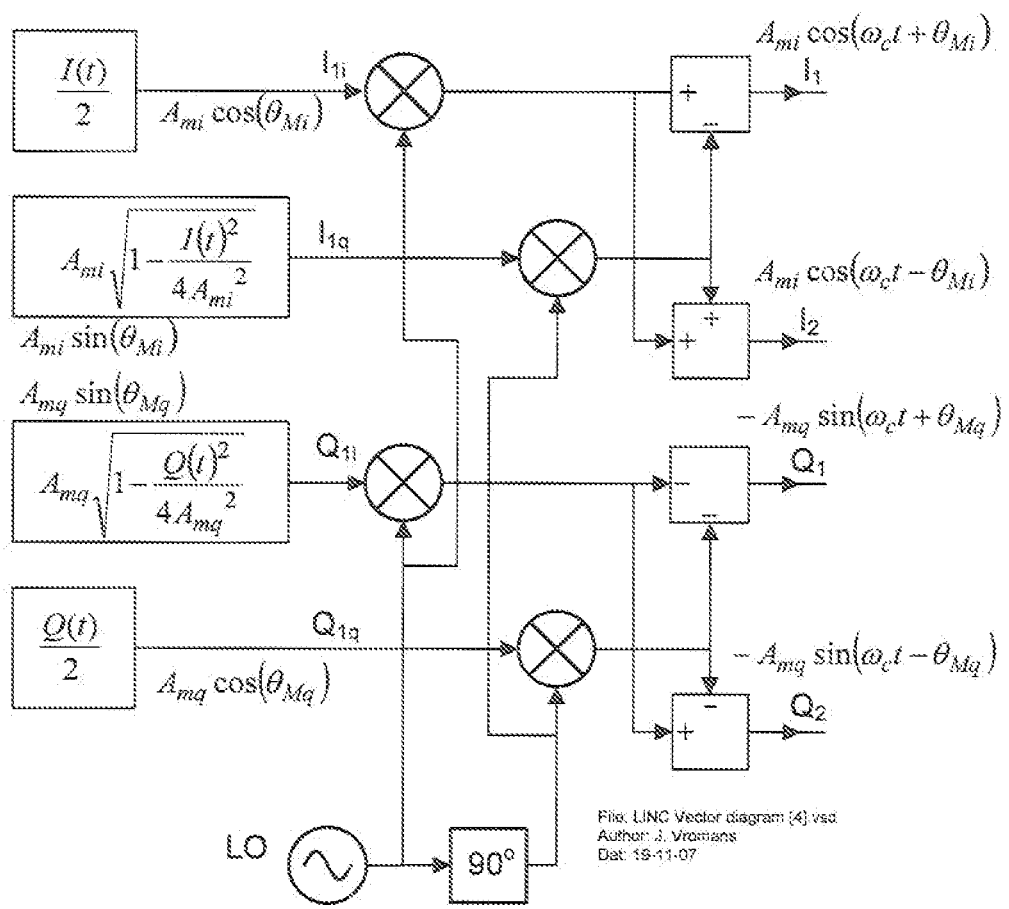
FIG. 12 illustrates schematically a complex mixer unit.

FIG. 12 shows a complex mixer unit.

Figure 13:
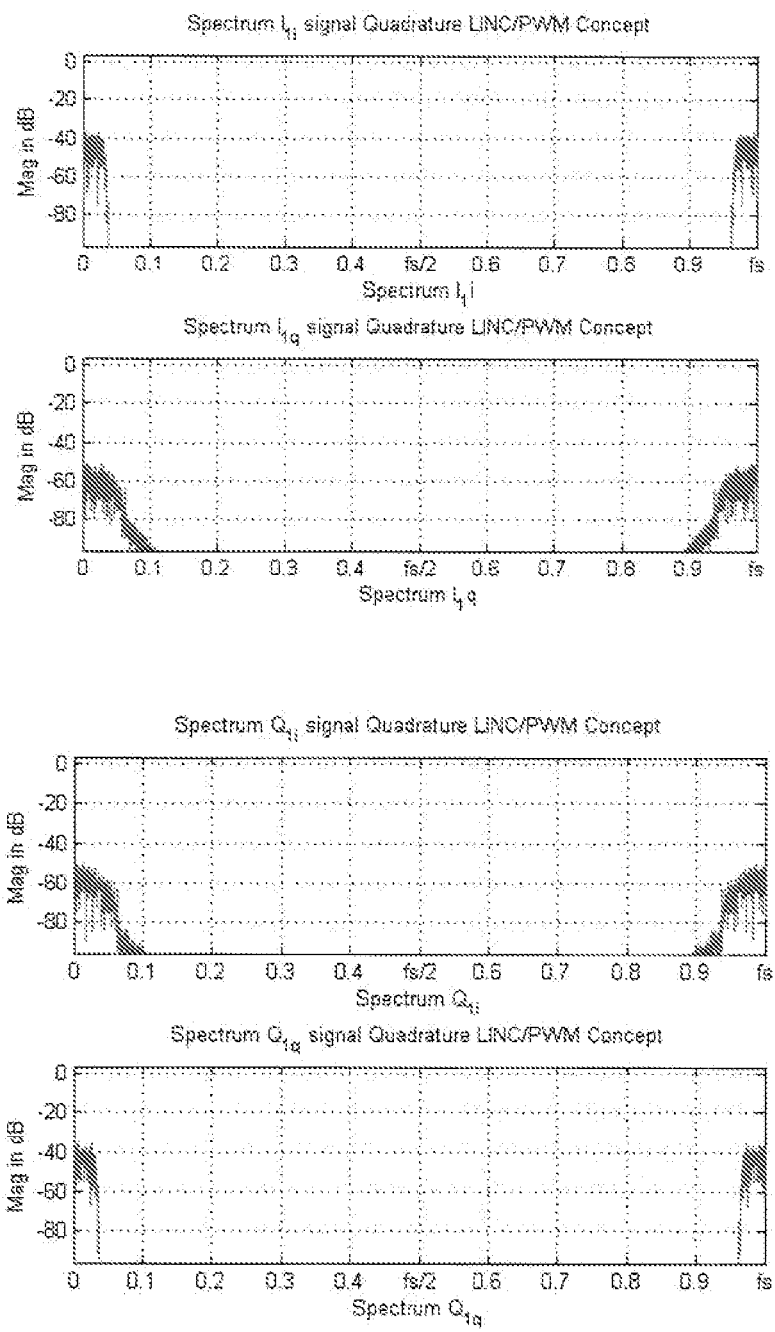
FIGS. 13 to 15 show the results of simulations.
Figure 14:
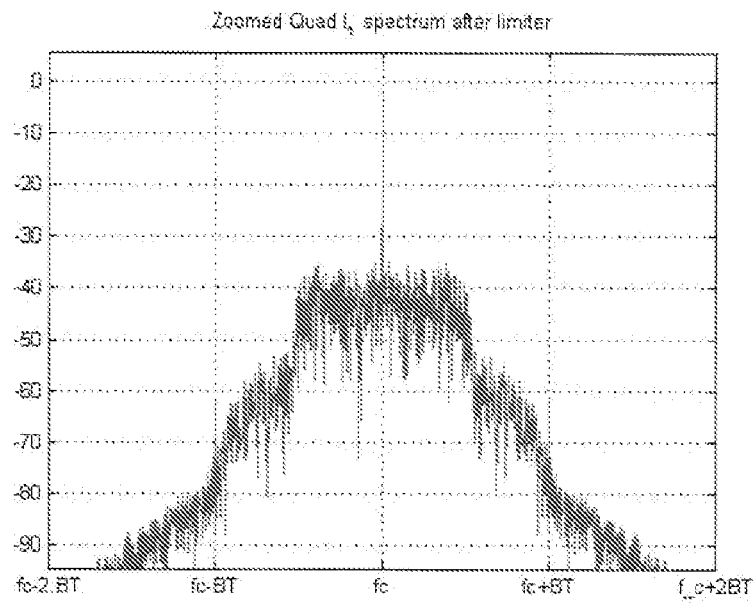
Figure 15:
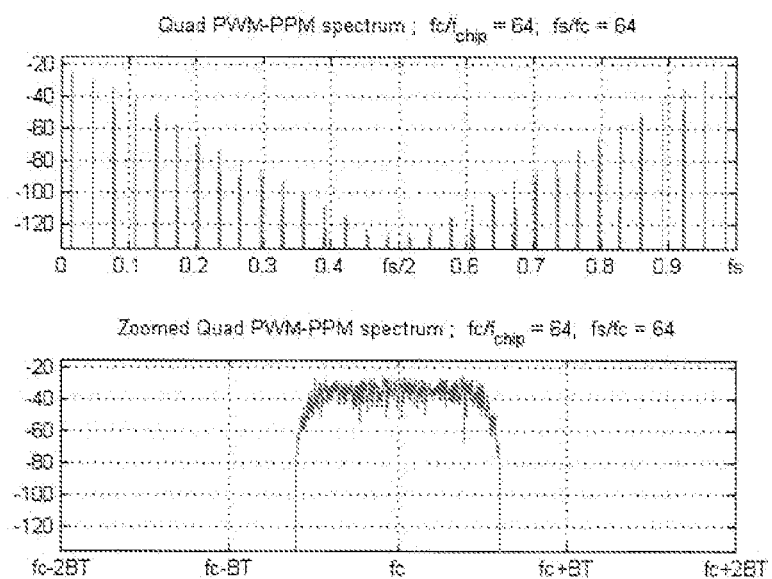

Simulations for the Quad separator are shown as FIGS. 13 to 15. The simulations were performed with the same WCDMA signal to those illustrated in FIGS. 7 to 9, and show an improvement in performance as there is very little bandwidth increase in baseband and at the quadrature RF carriers.

After combining the four switched branches we see the original transmitted RF WCDMA signal. The out of band noise is much lower than that illustrated in FIGS. 7 to 9, which means that despite the oversampling factor of 16 in baseband, we have still folding distortion in the conventional way of signal generation.

Chireix Principle

Figure 16:
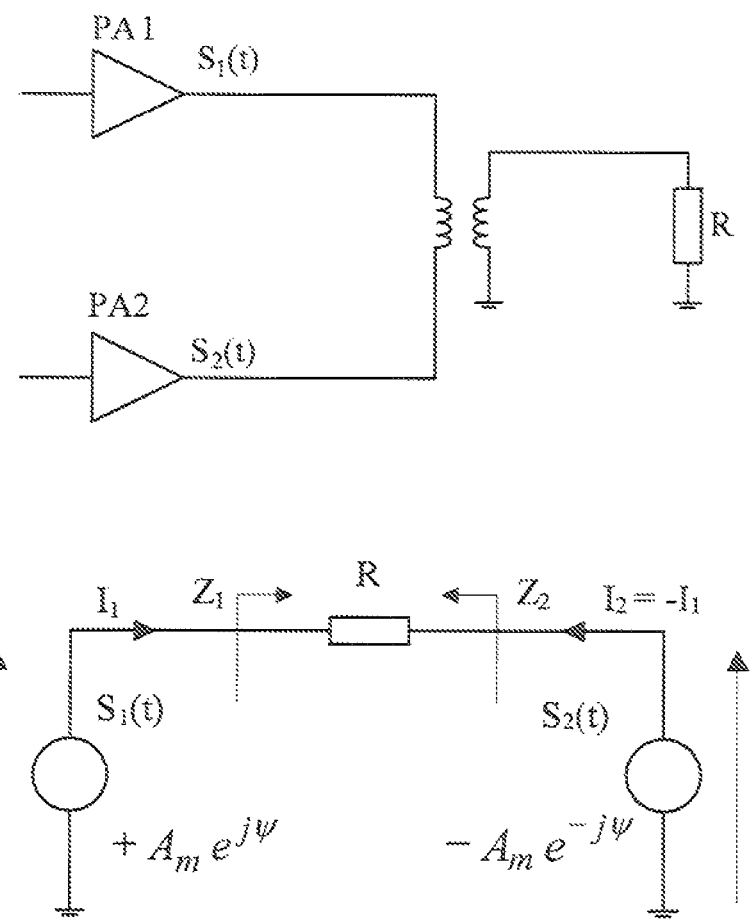
FIGS. 16 and 17 show block diagrams and circuits illustrative of the Chireix principle.
Figure 17:
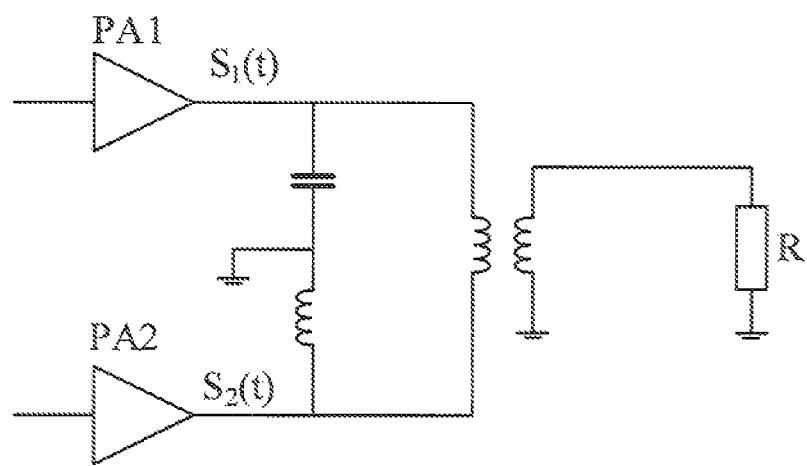
Figure 17:
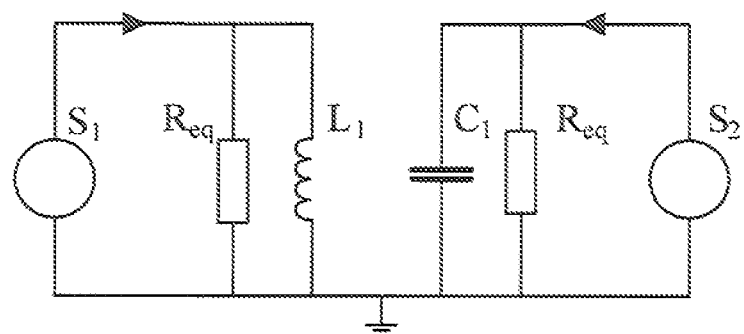

FIG. 16 shows a block diagram and equivalent circuit illustrative of the Chireix principle, and FIG. 17 shows a block diagram and equivalent circuit of a circuit that has been Chireix compensated by adding an inductor and capacitor to the circuit of FIG. 16.

The Chireix power combiner circuit comprises a first power amplifier and a second power amplifier. It is known that the phase difference between the signals generated by the two power amplifiers causes a reactive component to be seen by the output voltages of the power amplifiers. This means that as the phase difference between the output signals of the power amplifiers decreases towards zero, the out-phasing action reduces the composite output envelope value, and the reactive component starts to have a bigger impact on the load impedance, in effect reducing the efficiency.

The main idea of a Chireix combiner is to add a parallel compensating capacitor to shunt the voltage output of the first power amplifier, and to add a parallel compensating inductor to shunt the voltage output by the second power amplifier. In this way, the reactive part of the load impedance can be cancelled out such that the load impedance seen by the output voltages of the power amplifiers is purely resistive, therefore enabling improved or maximum power combining efficiency to be achieved.

The output signals of two PAs in an out-phasing configuration is given by:

$$S_1(t) = +A_m e^{j(\omega_c t + \theta_P + \theta_M)}$$

$$S_2(t) = -A_m e^{j(\omega_c t + \theta_P - \theta_M)} \quad (41)$$

The equation for $S_2$ has a negative sign to get maximum output signal for $\Psi = 0$.

The total loop current is given by:

$$I_1(t) = \frac{S_1(t) - S_2(t)}{R} = \frac{2A_m \cos(\theta_M)}{R} e^{j(\omega_c t + \theta_P)} \quad (42)$$

The impedances encountered by the signals $S_1$ and $S_2$ respectively are:

$$Z_1 = \frac{S_1}{I_1} = \frac{R}{2\cos(\theta_M)} e^{+j(\theta_M)} \quad (43\text{-}45)$$

$$Z_2 = \frac{S_2}{I_2} = -\frac{S_2}{I_1} = \frac{R}{2\cos(\theta_M)} e^{-j(\theta_M)}$$

$$Z_1 = \frac{R}{2} \cdot \frac{\cos(\theta_M) + j\sin(\theta_M)}{\cos(\theta_M)} = \frac{R}{2}(1 + j\tan(\theta_M))$$

$$Z_2 = \frac{R}{2} \cdot \frac{\cos(\theta_M) - j\sin(\theta_M)}{\cos(\theta_M)} = \frac{R}{2}(1 - j\tan(\theta_M))$$

$$Y_1 = \frac{2}{R} \cdot \frac{\cos(\theta_M)}{\cos(\theta_M) + j\sin(\theta_M)}$$

$$= \frac{2\cos(\theta_M)}{R}(\cos(\theta_M) - j\sin(\theta_M))$$

$$Y_2 = \frac{2}{R} \cdot \frac{\cos(\theta_M)}{\cos(\theta_M) - j\sin(\theta_M)}$$

$$= \frac{2\cos(\theta_M)}{R}(\cos(\theta_M) + j\sin(\theta_M))$$

$Y_1$ represents a equivalent resistor in parallel with a coil and $Y_2$ represents the same resistor in parallel with a capacitor. The load of the power amplifiers is not constant and depends on the phase difference between the output voltages. The load is real and has a value of R/2 for $\theta_M = 0$. For $\theta_M = \pi/2$ the impedance is real but infinity (open load).

$$Y_1 = Y_R - jY_L = \frac{2\cos(\theta_M)}{R}(\cos(\theta_M) - j\sin(\theta_M)) \quad (46)$$

$$Y_2 = Y_R + jY_C = \frac{2\cos(\theta_M)}{R}(\cos(\theta_M) + j\sin(\theta_M))$$

The equivalent resistor $R_{eq}$ encountered by signal $S_1$ and $S_2$ is:

$$Y_R = \frac{2\cos^2(\theta_M)}{R} \quad (47)$$

$$R_{eq} = \frac{1}{Y_R} = \frac{R}{2\cos^2(\theta_M)}$$

The equivalent inductor/coil $L_1$ encountered by signal $S_1$ is:

$$Y_L = \frac{1}{\omega_c L_1} = \frac{2\cos(\theta_M)\sin(\theta_M)}{R} \quad (48)$$

$$L_1 = \frac{R}{\omega_c \cdot 2\cos(\theta_M)\sin(\theta_M)}$$

The equivalent capacitor $C_1$ encountered by signal $S_2$ is:

$$Y_C = \omega_c C_1 = \frac{2\cos(\theta_M)\sin(\theta_M)}{R} \quad (49)$$

$$C_1 = \frac{2\cos(\theta_M)\sin(\theta_M)}{\omega_c \cdot R}$$

For an RF carrier frequency and a phase value for $\theta_M$ the load can be made real again by placing respectively a capacitor and a coil at the output of the two power amplifiers.

This is the Chireix combining method, and the block diagram and Chireix equivalent circuit showing the equivalent resistor $R_{eq}$, equivalent Chireix inductor $L_1$, and equivalent capacitor $C_1$ is shown as FIG. 17. This is an example of a Chireix compensation circuit.

Returning to the circuit for a transmitter of FIG. 2, and the Chireix compensation circuits illustrated as FIGS. 3a and 3b, there now follows a more detailed analysis of the Chireix compensation circuits.

Figure 18:
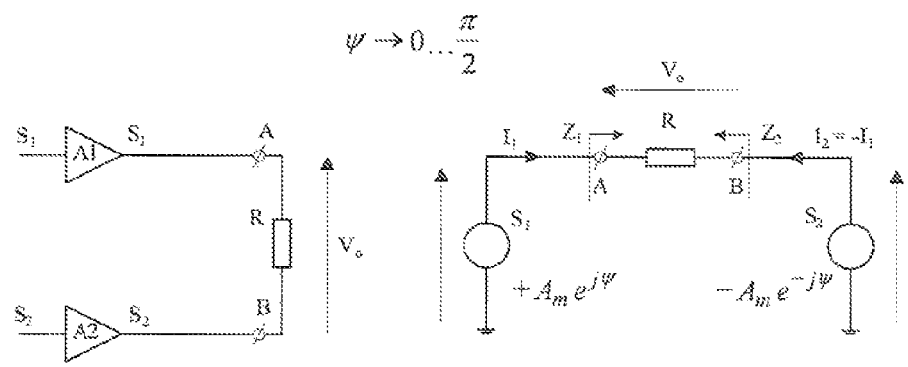
FIG. 18 illustrates a block diagram and equivalent circuit of a first Chireix compensated circuit.

The design of the first Chireix compensation circuit illustrated as FIG. 3a will now be described with reference to FIG. 18. FIG. 18 shows a block diagram and equivalent circuit of the outputs of the power amplifiers that is used to design the placement and orientation of the Chireix capacitor, Chireix inductor and connections to the load.

For the output signals of the power amplifiers A1 and A2 we can write:

$$S_1 = +A_m e^{j\Psi}$$

$$S_2 = -A_m e^{-j\Psi} \quad (50)$$

Which results in the following output voltage over the load impedance:

$$V_o = V_{AB} = S_1 - S_2 = +A_m e^{j\Psi} - (-A_m e^{-j\Psi})$$

$$V_o = 2A_m \cos(\Psi) \quad (51)$$

The current in the loop can be calculated with Kirchhoff's voltage law:

$$S_1 - I_1 R - S_2 = 0 \quad (52)$$

$$I_1 = \frac{S_1 - S_2}{R} = \frac{2A_m \cos(\psi)}{R}$$

Each power amplifier sees a different load impedance given by:

$$Z_1 = \frac{S_1}{I_1} = \frac{R}{2A_m\cos(\psi)}e^{j\psi} \quad (53)$$

$$Z_2 = \frac{S_2}{-I_1} = \frac{R}{2A_m\cos(\psi)}e^{-j\psi}$$

For a phase variation from 0° to 90°, $Z_1$ has an inductive impedance and $Z_2$ a capacitive impedance. This can be compensated by adding, respectively, an extra parallel capacitor at the output of the power amplifier A1 and an extra parallel inductor at the output of the amplifier A2.

However, because the phase variation of a Quad LINC separator can be between 0° and 180°, there is a need to interchange the compensation capacitor and inductor for a phase variation between 90° and 180°. In this embodiment, an additional circuit shown above as FIG. 3$b$ is used for the range from 90° to 180°. The additional circuit shown as FIG. 3$b$ may, or may not, share components with the first Chireix compensation circuit.

Figure 19:
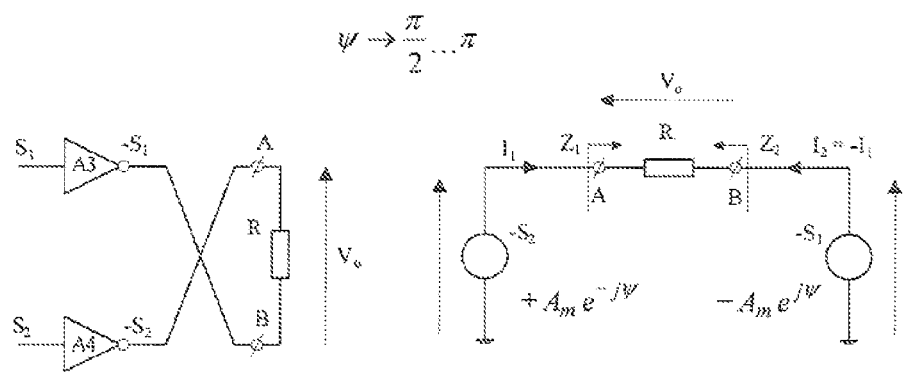
FIG. 19 illustrates a block diagram and equivalent circuit of a second Chireix compensated circuit.

The design of the second Chireix compensation circuit illustrated as FIG. 3$b$ will now be described with reference to FIG. 19. FIG. 19 shows a block diagram and equivalent circuit of the outputs of the power amplifiers that are used to design the placement and orientation of the Chireix capacitor, Chireix inductor and connections to the load.

For the phase range from 90° to 180°, the polarity of the I signal is reversed. This information is used to switch into the configuration as shown as FIGS. 3$b$ and 19.

The output signals of the power amplifiers A3 and A4 are given by:

$$V_o = V_{AB} = -S_2 - (-S_1) = S_1 - S_2$$

$$V_o = 2A_m \cos(\Psi) \quad (54)$$

The output signal is not changed compared with the output signal of FIG. 18, and becomes negative in the phase range from 90° to 180°.

The current equation is given by:

$$-S_2 - I_1 R - (-S_1) = 0 \quad (55)$$

$$I_1 = \frac{S_1 - S_2}{R} = \frac{2A_m\cos(\psi)}{R}$$

This relationship is not different to the situation of FIG. 18. However, the load impedance is changed and given by the following equations:

$$Z_1 = \frac{-S_2}{I_1} = \frac{R}{2A_m\cos(\psi)}e^{j\psi} \quad (56)$$

$$Z_2 = \frac{-S_1}{-I_1} = \frac{R}{2A_m\cos(\psi)}e^{-j\psi}$$

For the phase region from 90° to 180°, the impedance is identical to the impedance of the previous state in the phase range from 0° to 90°, which means that there is no need to interchange the compensating capacitor and inductor.

In this way, the Chireix compensation works over the whole phase range from 0° to 180°.

The invention claimed is:

1. A circuit for a transmitter configured to receive one or more input signals comprising:
   a load;
   a first Chireix compensation circuit comprising:
      a first power amplifier,
      a second power amplifier,
      a first Chireix inductor, and
      a first Chireix capacitor, wherein an output of the first Chireix compensation circuit is coupled to the load;
   a second Chireix compensation circuit comprising:
      a third power amplifier,
      a fourth power amplifier,
      a second Chireix inductor, and
      a second Chireix capacitor, wherein an output of the second Chireix compensation circuit is coupled to the load; and
   a switch configured to couple one or more Chireix input signals derived from the one or more input signals to either the first or second Chireix compensation circuits in accordance with a characteristic of the one or more input signals, wherein the outputs of the first and second Chireix compensation circuits are coupled to the load in reverse bias relative to each other.

2. The circuit of claim 1, wherein the characteristic of the one or more input signals is the phase of the one or more input signals.

3. The circuit of claim 1, wherein the first power amplifier and the second power amplifier have a positive gain, and the third power amplifier and the fourth power amplifier have a negative gain.

4. The circuit of claim 1, configured to process in-phase and quadrature real radio frequency envelope signals as the one or more input signals.

5. The circuit of claim 1, wherein the one or more input signals comprise real and imaginary baseband signals, and the circuit further comprises:
   a mixer unit configured to process the real and imaginary baseband signals to generate the one or more Chireix input signals, and wherein the one or more Chireix input signals comprise real radio frequency envelope signals.

6. The circuit according to claim 1, wherein the one or more input signals comprise an in-phase signal and a quadrature signal, and the circuit further comprises:
   a separator unit configured to process the in-phase and quadrature signals and generate real and imaginary baseband signals; and
   a mixer unit configured to process the real and imaginary baseband signals to generate the one or more Chireix input signals, wherein the one or more Chireix input signals comprise real radio frequency envelope signals.

7. The circuit of claim 6, wherein the separator unit is a quad LINC separator unit.

8. The circuit of claim 6, further comprising:
   a quadrature branch load;
   a third Chireix compensation circuit comprising:
      a fifth power amplifier,
      a sixth power amplifier,
      a third Chireix inductor, and
      a third Chireix capacitor, wherein an output of the third Chireix compensation circuit is coupled to the quadrature branch load; and
   a fourth Chireix compensation circuit comprising:
      a seventh power amplifier,
      a eighth power amplifier,
      a fourth Chireix inductor and a fourth Chireix capacitor, wherein an output of the fourth Chireix compensation circuit is coupled to the quadrature branch load. the outputs of the third and fourth Chireix compensation circuits are coupled to the quadrature branch load in reverse bias relative to each other, the first and second Chireix compensation circuits are configured to process in-phase signals, and the third and fourth Chireix compensation circuits are configured to process quadrature signals.

9. The circuit of claim 8, wherein the first power amplifier and the second power amplifier of the third Chireix compensation circuit have a positive gain, and the third power amplifier and the fourth power amplifier of the fourth Chireix compensation circuit have a negative gain.

10. The circuit of claim 8, wherein the separator unit is configured to generate a first phase signal representative of a phase of the in-phase signal, and a second phase signal representative of a phase of the quadrature signal, and the circuit further comprises:
   a first switch operable in accordance with the first phase signal to connect or disconnect the first in-phase real radio frequency envelope signal to the first Chireix compensation circuit;
   a second switch operable in accordance with the first phase signal to connect or disconnect the second in-phase real radio frequency envelope signal to the first Chireix compensation circuit;
   a third switch operable in accordance with the first phase signal to connect or disconnect the first in-phase real radio frequency envelope signal to the second Chireix compensation circuit;
   a fourth switch operable in accordance with the first phase signal to connect or disconnect the second in-phase real radio frequency envelope signal to the second Chireix compensation circuit;
   a fifth switch operable in accordance with the second phase signal to connect or disconnect the first quadrature real radio frequency envelope signal to the third Chireix compensation circuit;
   a sixth switch operable in accordance with the second phase signal to connect or disconnect the second quadrature real radio frequency envelope signal to the third Chireix compensation circuit;
   a seventh switch operable in accordance with the second phase signal to connect or disconnect the first quadrature real radio frequency envelope signal to the fourth Chireix compensation circuit;
   an eighth switch operable in accordance with the second phase signal to connect or disconnect the second quadrature real radio frequency envelope signal to the fourth Chireix compensation circuit.

11. The circuit of claim 10, wherein the first and second switches are mutually exclusively operable with the third and fourth switches, and the fifth and sixth switches are mutually exclusively operable with the seventh and eighth switches.

12. The circuit of claim 10, wherein the first Chireix inductor and the first Chireix capacitor are connected in series between the outputs of the first power amplifier and the second power amplifier and the second Chireix inductor and the second Chireix capacitor are connected in series between the outputs of the third power amplifier and the fourth power amplifier.

13. A circuit for a transmitter comprising: an in-phase branch of components; and a quadrature branch of components, wherein the in-phase branch is configured to receive first and second in-phase constant baseband envelope signals and a first phase signal, and comprises:
   a load;
   a first Chireix compensation circuit comprising:
      a first power amplifier,
      a second power amplifier,
      a first Chireix inductor, and
      a first Chireix capacitor, wherein an output of the first Chireix compensation circuit is coupled to the load;
   a second Chireix compensation circuit comprising:
      a third power amplifier,
      a fourth power amplifier,
      a second Chireix inductor, and
      a second Chireix capacitor, wherein an output of the second Chireix compensation circuit is coupled to the load, and the outputs of the first and second Chireix compensation circuits are coupled to the load in reverse bias relative to each other;
   first switches configured to couple the first in-phase constant baseband envelope signal and second in-phase constant baseband envelope signal to either the first or second Chireix compensation circuits in accordance with the first phase signal, wherein the quadrature branch is configured to receive first and second quadrature constant baseband envelope signals and a second phase signal, and comprises:
   a quadrature branch load;
   a third Chireix compensation circuit comprising:
      a fifth power amplifier,
      a sixth power amplifier,
      a third Chireix inductor, and
      a third Chireix capacitor, wherein an output of the third Chireix compensation circuit is coupled to the quadrature branch load; and
   a fourth Chireix compensation circuit comprising:
      a seventh power amplifier,
      an eighth power amplifier,
      a fourth Chireix inductor, and
      a fourth Chireix capacitor, wherein an output of the fourth Chireix compensation circuit is coupled to the quadrature branch load, the outputs of the third and fourth Chireix compensation circuits are coupled to the quadrature branch load in reverse bias relative to each other; and
   second switches configured to couple the first quadrature constant baseband envelope signal and second quadrature constant baseband envelope signal to either the third or fourth Chireix compensation circuits in accordance with the second phase signal.

14. A transmitter comprising a circuit according to claim 13.

* * * * *